(12) United States Patent
Chan et al.

(10) Patent No.: US 10,957,717 B2
(45) Date of Patent: Mar. 23, 2021

(54) PIXEL ARRAY

(71) Applicant: E Ink Holdings Inc., Hsinchu (TW)

(72) Inventors: Po-Chuan Chan, Hsinchu (TW); Wen-Yu Kuo, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 16/565,517

(22) Filed: Sep. 10, 2019

(65) Prior Publication Data

US 2020/0111812 A1 Apr. 9, 2020

(30) Foreign Application Priority Data

Oct. 8, 2018 (TW) .............................. 107135441 A

(51) Int. Cl.
*H01L 27/12* (2006.01)
(52) U.S. Cl.
CPC ........ *H01L 27/124* (2013.01); *H01L 27/1259* (2013.01)
(58) Field of Classification Search
CPC .................................................. H01L 27/124
See application file for complete search history.

(56) References Cited

U.S. PATENT DOCUMENTS

| | | | |
|---|---|---|---|
| 9,459,445 B1 | 10/2016 | Notermans et al. | |
| 2007/0241999 A1 | 10/2007 | Lin | |
| 2009/0189850 A1 | 7/2009 | Murayama et al. | |
| 2010/0085343 A1 | 4/2010 | Yamada | |
| 2013/0285996 A1 | 10/2013 | Lee et al. | |
| 2015/0009105 A1 | 1/2015 | Nomura | |
| 2015/0206478 A1 | 7/2015 | Yamazaki | |
| 2018/0130825 A1* | 5/2018 | Wu ........................ H01L 27/124 |

FOREIGN PATENT DOCUMENTS

| | | |
|---|---|---|
| TW | 201519197 A | 5/2015 |
| TW | 201638920 A | 11/2016 |
| TW | 201738637 A | 11/2017 |
| TW | I634531 B | 9/2018 |

OTHER PUBLICATIONS

Corresponding Taiwan office action dated May 27, 2019.

\* cited by examiner

*Primary Examiner* — Marcos D. Pizarro
*Assistant Examiner* — Antonio B Crite
(74) *Attorney, Agent, or Firm* — CKC & Partners Co., LLC

(57) ABSTRACT

A pixel array includes first signal lines, second signal lines, active components, pixel electrodes, and selection lines. The second signal lines are intersected with and electrically insulated to the first signal lines. Each active component is electrically connected to one of the first signal lines and one of the second signal lines. Each pixel electrode is electrically connected to one of the active components. The selection lines are intersected with the first signal lines to form a plurality of first intersections and second intersections. The selection lines are electrically connected to the first signal lines at the first intersections but electrically insulated to the first signal lines at second intersections. The selection lines are electrically insulated to the second signal lines. At least one of the second signal lines is disposed between each selection line and any one of the active components.

9 Claims, 5 Drawing Sheets

PIXEL ARRAY

CROSS-REFERENCE TO RELATED APPLICATION

This application claims priority to Taiwan Application Ser. No. 107135441, filed Oct. 8, 2018, which is herein incorporated by reference.

BACKGROUND

Field of Invention

The present disclosure relates to a pixel array. More particularly, the present disclosure relates to a pixel array having at least one signal line disposed between an active component and a selection line.

Description of Related Art

Display panels have been widely used in a wide variety of display devices, such as televisions, notebook computers, tablet computers, e-paper books, mobile phones, etc. Pixel arrays in conventional display panels include two kinds of signal lines—in which they are intersected to each other—and pixel units electrically connected to the two kinds of signal lines. The first kind of signal lines are electrically connected to the selection lines that are electrically connected to the signal source, and receive the signal from the signal source through the selection line. The second kind of signal lines are extended towards and connected to the signal source to receive the signal from the signal source. However, when the signal is transmitted on the selection line, the signal may impact the performance of the pixel units near to the selection line, especially on the pixel units near to where the selection line is electrically connected to the first signal line. The signal of the surrounding pixel units may be coupled with the signal transmitted on the selection lines, causing a color unevenness issue (mura) of the display. For example, the color unevenness issue can be observed on the diagonal of the display, such that the display quality is decreased.

Therefore, there is an urgent call for a novel pixel array to address the above-mentioned issue.

SUMMARY

The present disclosure provides a pixel array including a plurality of first signal lines, a plurality of second signal lines, a plurality of active components, a plurality of pixel electrodes and a plurality of selection lines. The second signal lines are intersected with and electrically insulated to the first signal lines. Each of the active components is electrically connected to one of the first signal lines and one of the second signal lines. Each of the pixel electrodes is electrically connected to one of the active components. The selection lines are intersected with the first signal lines to form a plurality of first intersections and a plurality of second intersections. The selection lines are electrically connected to the first signal lines at the first intersections but electrically insulated to the first signal lines at the second intersections. The selection lines are electrically insulated to the second signal lines. At least one of the second signal lines is disposed between each of the selection lines and any one of the active components.

In some embodiments, two of the second signal lines and one of the selection lines between said two second signal lines are disposed between adjacent ones of the active components.

In some embodiments, the second signal lines are twice as many of the selection lines.

In some embodiments, the second signal lines are twice as many of the first signal lines.

In some embodiments, a number of the first signal lines is less than or equal to a number of the selection lines.

In some embodiments, each of the first signal lines is a scanning line, and each of the second signal lines is a data line.

In some embodiments, the selection lines and the second signal lines are made of the same material.

In some embodiments, the pixel array further includes an insulating layer disposed between the first signal lines and the second signal lines, and the first signal lines are electrically insulated by the insulating layer from the second signal lines.

In some embodiments, the pixel array further includes an insulating layer disposed between the first signal lines and the selection lines, and the first signal lines are electrically insulated by the insulating layer from the selection lines at the second intersections.

In some embodiments, the second signal lines and the selection lines are extended along the same direction.

It is understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures.

DETAILED DESCRIPTION

Figure 1:
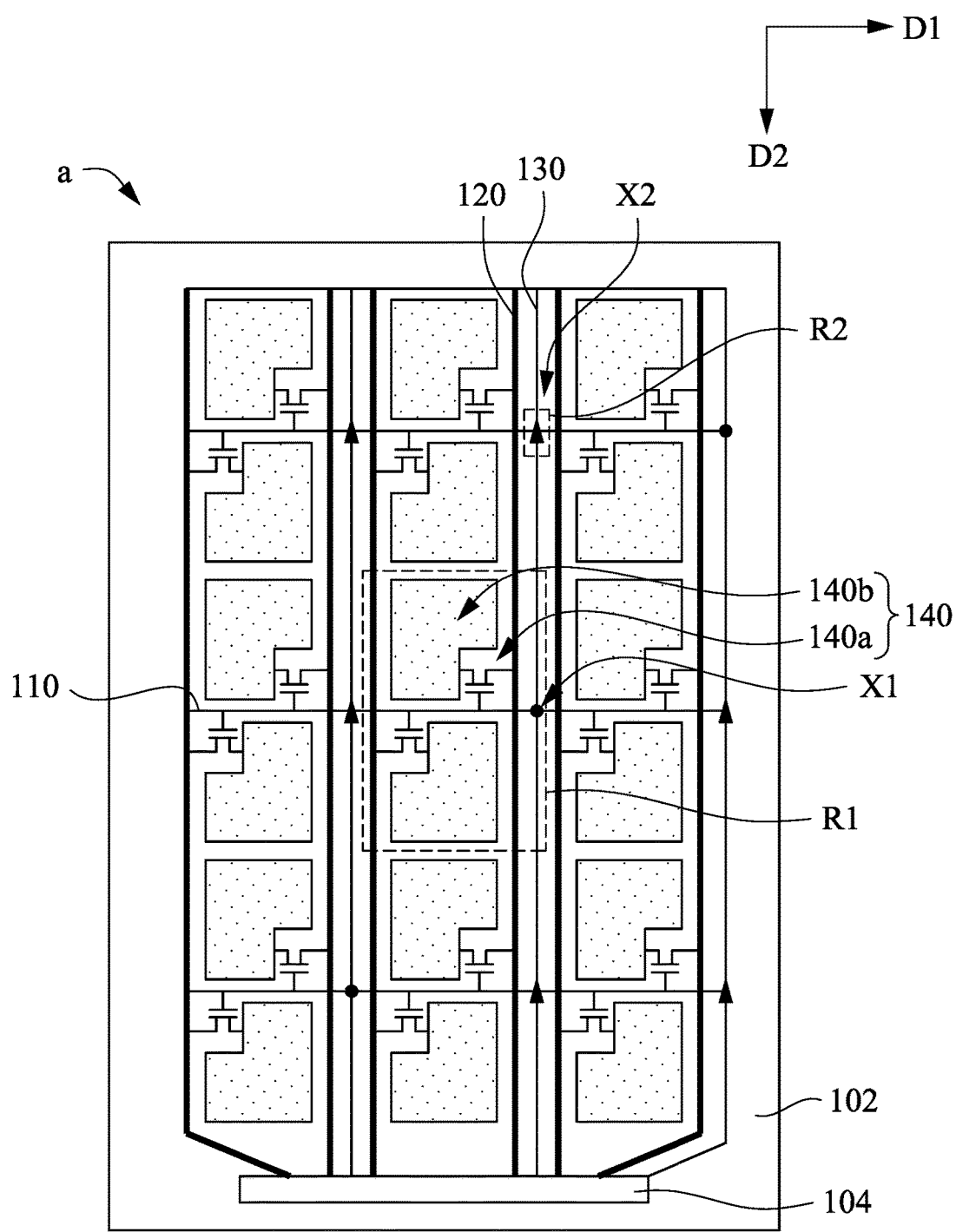
FIG. 1 illustrates a schematic top view of a pixel array substrate according to some embodiments of the present disclosure.

The disclosure can be more fully understood by reading the following detailed description of the embodiment, with reference made to the accompanying drawings as follows. Like reference numerals denote like features throughout specification and drawings.

The following embodiments are disclosed with accompanying diagrams for a detailed description. For illustration clarity, many details of practice are explained in the following descriptions. However, it should be understood that these details of practice do not intend to limit the present invention. That is, these details of practice are not necessary in parts of embodiments of the present disclosure. Further-more, for simplifying the drawings, some of the conventional structures and elements are shown with schematic illustrations.

Figure 2:
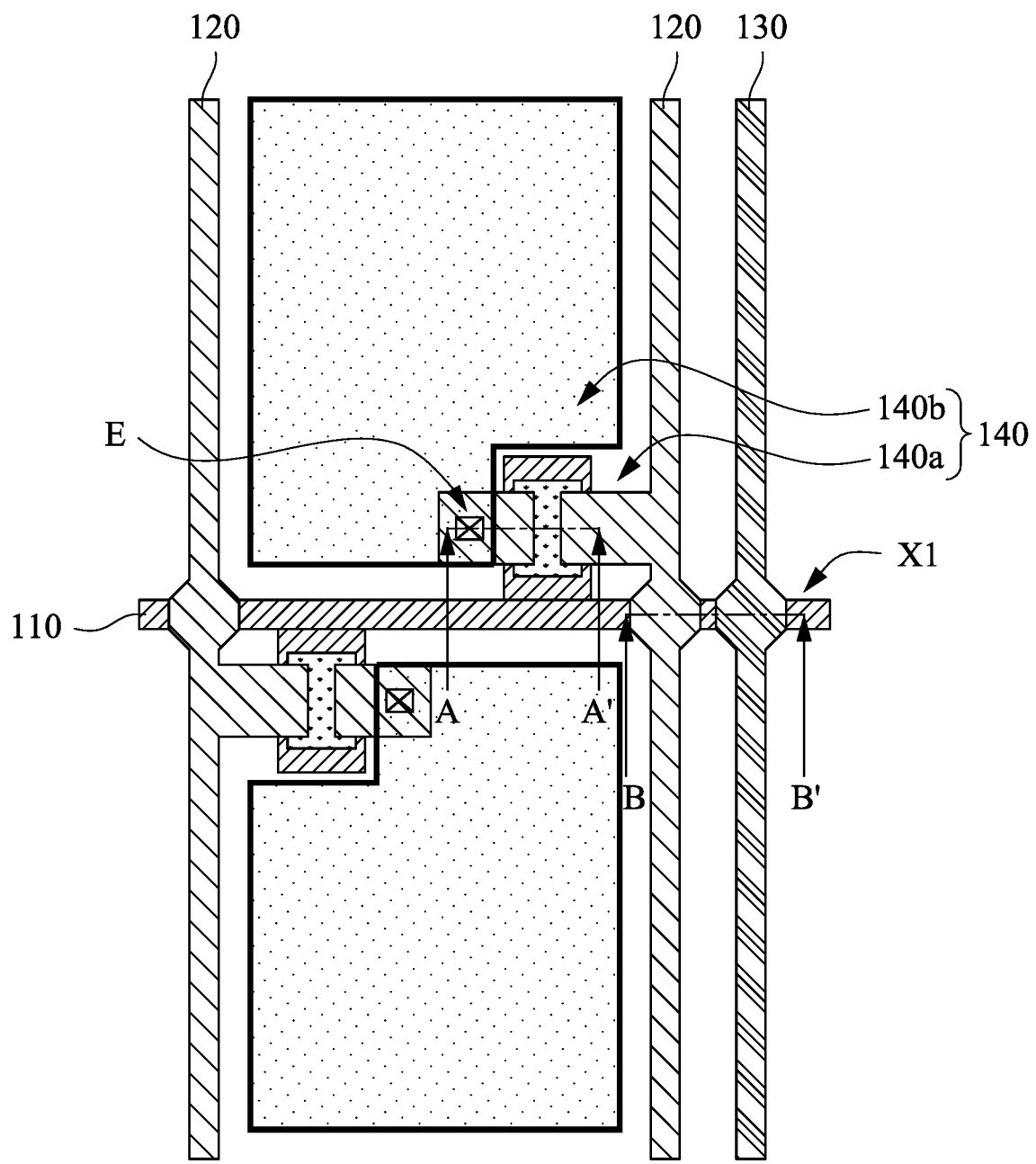
FIG. 2 is a schematic enlarged view of a region R1 in FIG. 1.
Figure 3:
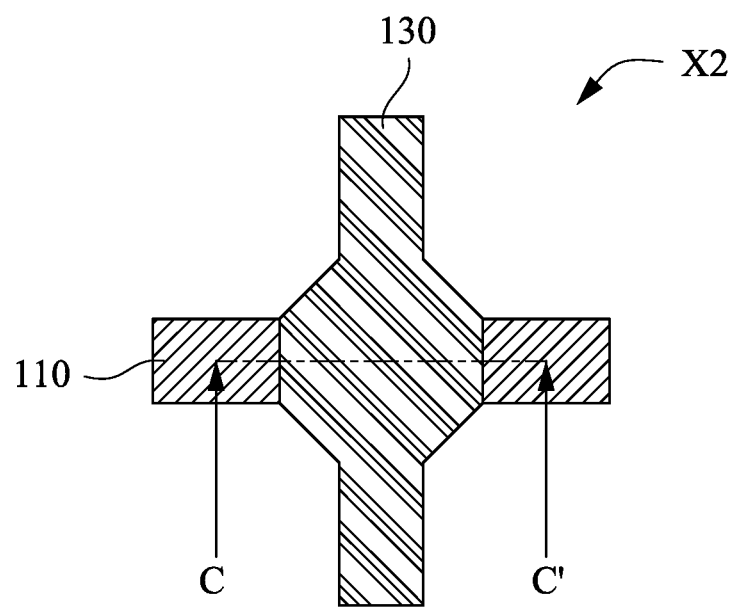
FIG. 3 is a schematic enlarged view of a region R2 in FIG. 1.

FIG. 1 illustrates a schematic top view of a pixel array substrate 100 according to some embodiments of the present disclosure. FIG. 2 is a schematic enlarged view of a region R1 in FIG. 1. FIG. 3 is a schematic enlarged view of a region R2 in FIG. 1. The pixel array substrate 100 includes a substrate 102, a signal source 104, and a pixel array "a". The signal source 104 and the pixel array "a" are disposed on the substrate 102. The pixel array "a" includes a plurality of first signal lines 110, a plurality of second signal lines 120, a plurality of selection lines 130, and a plurality of pixel units 140. Each of the pixel units 140 includes an active component 140a and a pixel electrode 140b. The second signal line 120 and the selection line 130 of the pixel array "a" are electrically connected to the signal source 104 so as to receive a signal from the signal source 104.

As shown in FIG. 1, the first signal lines 110 are intersected with the second signal lines 120 and electrically insulated to the second signal lines 120. Each of the active components 140a is electrically connected to one of the first signal lines 110 and one of the second signal lines 120. Each of the pixel electrodes 140b is electrically connected to one of the active components 140a. The shape of the pixel electrode 140b shown in FIG. 1 is merely illustrative, and the shape of the pixel electrode 140b may vary according to various layout design.

In some embodiments, the first signal lines 110 extend in a first direction D1 and are separately arranged along a second direction D2. The second signal lines 120 extend in the second direction D2, and are separately arranged along the first direction D1. The selection lines 130 extend in the second direction D2, and are separately arranged along the first direction D1. The first direction D1 is different from the second direction D2. In some embodiments, the first direction D1 is substantially perpendicular to the second direction D2. In some embodiments, the second signal lines 120 and the selection lines 130 are extend along the same direction.

Reference is still made to FIG. 1. The selection lines 130 are intersected with the first signal lines 110 to form a plurality of first intersections X1 and a plurality of second intersections X2. The selection lines 130 are electrically connected to the first signal lines 110 at the first intersections X1, such that the signal from the signal source 104 may be transmitted to the first signal lines 110 through the selection lines 130. The selection lines 130 are electrically insulated to the first signal lines 110 at the second intersections X2. The selection lines 130 are electrically insulated to the second signal line. It is noted that at least one of the second signal line 120 is disposed between each of the selection lines 130 and one of the active components 140a of the pixel units 140. Since the signal transmitted by the selection lines 130 may be shielded by the second signal lines 120, the impact of the signal to the pixel units 140 may be reduced. Therefore, when the pixel array substrate 100 of the present disclosure is disposed in a display device, the color unevenness issue in the prior art may be avoided.

Reference is still made to FIG. 1. In the pixel array "a" of the present disclosure, two second signal lines 120 and one selection line 130 there between are arranged between two adjacent active components 140a. Therefore, the second signal lines 120 on the left and right sides of the selection lines 130 may shield the interference from the signal transmitted on the selection lines 130. In addition, since each of the second signal lines 120 is disposed between the selection lines 130 and the active component 140a, the selections line 130 are not so close to the active component 140a. Therefore, the impact on the surrounding pixel units 140 from the signal transmitted on the selection lines 130 may be reduced, and the color unevenness issue of the display may be avoided.

The pixel array substrate of the present disclosure may be disposed in various display devices, and the color unevenness phenomenon in the prior art may be avoided. For example, the pixel array substrate of the present disclosure may serve as an active array substrate in an electronic paper displays (EPD). The electronic paper displays may include the pixel array substrate disclosed herein and a display film disposed thereon, and the display particles in the display film may be driven by the pixel array substrate to exhibit a display image. The layout of the pixel array in the pixel array substrate of the present disclosure may avoid the color unevenness issue of the display devices and increase the display quality.

In some embodiments, the number of the second signal lines 120 is greater than that of the selection lines 130. For example, as shown in FIG. 1, the second signal lines 120 are twice as many of the selection lines 130, but it is not limited thereto. In some embodiments, the number of the second signal lines 120 is greater than that of the first signal lines 110. For example, as shown in FIG. 1, the second signal lines 120 are twice as many of the first signal lines 110, but the present disclosure is not limited thereto. In some embodiments, as shown in FIG. 1, the number of the first signal lines 110 is equal to that of the selection lines 130, but the present disclosure is not limited thereto.

Figure 4A:
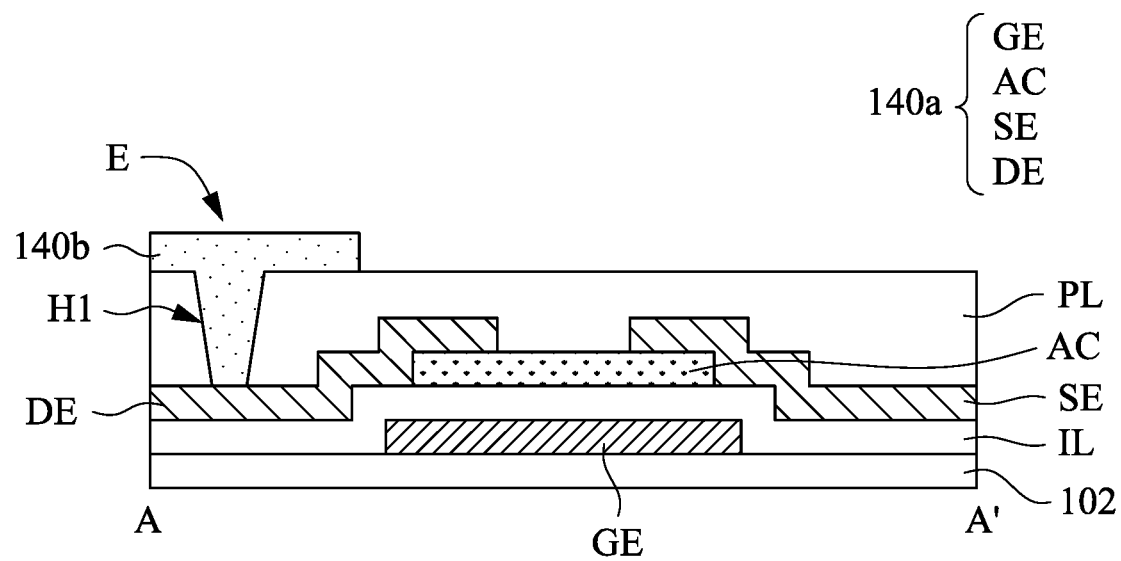
FIG. 4A illustrates a schematic sectional view along line A-A' of FIG. 2.

Next, reference is made to FIG. 2 and FIG. 4A. FIG. 4A illustrates a sectional view along line A-A' of FIG. 2. Each of the active components 140a includes a gate GE, an active layer AC, a source SE, and a drain DE. The gate GE is disposed on the substrate 102. The active layer AC is disposed over the gate GE. The source SE and the drain DE are disposed on the active layer AC. In some embodiments, the pixel array "a" further includes an insulating layer IL disposed between the gate GE and the active layer AC and covering the gate GE and the substrate 102. In some embodiments, the pixel array "a" further includes a protecting layer PL covering the active layer AC, the source SE, and the drain DE. The drain DE is electrically connected to the pixel electrode 140b through an opening H1 of the protecting layer PL. In FIG. 2, a connecting part E indicates the position where the drain DE is electrically connected to the pixel electrode 140b.

As shown in FIG. 2 and FIG. 4A, each first signal line 110 is electrically connected to the gate GE, while each second signal line 120 is electrically connected to the source SE. Therefore, the first signal lines 110 are scanning lines, and the second signal lines 120 are data lines. Each of the first signal lines 110 is electrically connected to a corresponding one of the selection line 130, such that the signal from the signal source 104 (illustrated in FIG. 1) may be transmitted to the gate GE.

Figure 4B:
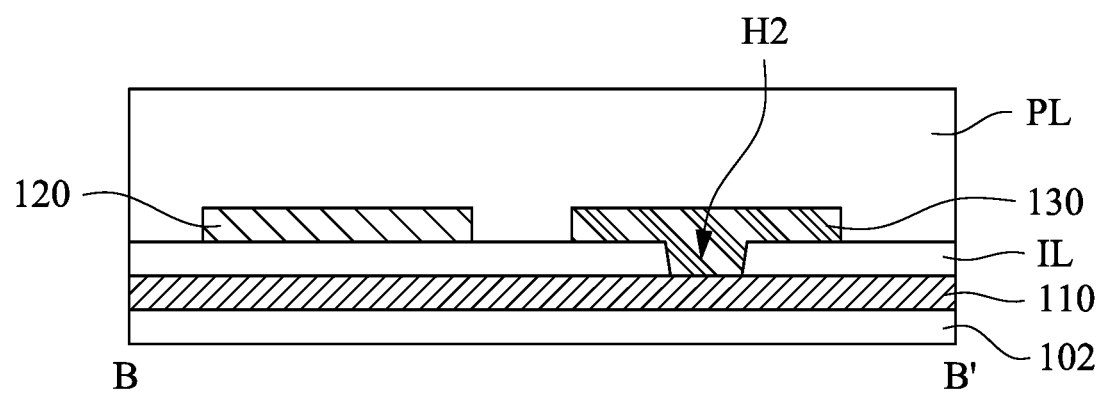
FIG. 4B illustrates a schematic sectional view along line B-B' of FIG. 2.

Next, reference is made to FIG. 2 and FIG. 4B. FIG. 4B illustrates a schematic sectional view along line B-B' of FIG. 2. In some embodiments, the pixel array "a" further includes an insulating layer IL disposed between the first signal lines 110 and the second signal lines 120. The insulating layer IL is also located between the first signal lines 110 and the selection lines 130. The first signal lines 110 are electrically insulated by the insulating layer IL from the second signal lines 120. Each selection line 130 is electrically connected to a corresponding one of the first signal line 110 through an opening H2 of the insulating layer IL. In some embodiments, the second signal line 120 and the selection line 130 may be formed by operations of: patterning an insulating layer to form the insulating layer IL having the opening H2; forming a conductive layer covering the insulating layer IL; patterning the conductive layer to form the second signal line 120 and the selection line 130. Accordingly, the selection lines 130 and the second signal lines 120 are made of the same material.

Figure 4C:
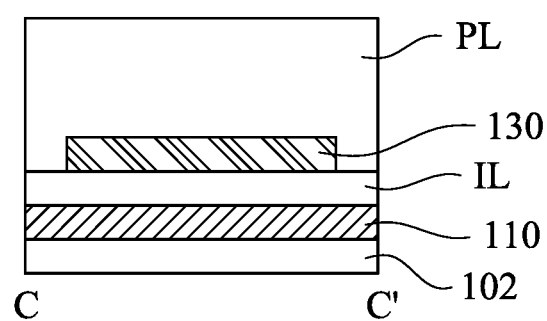
FIG. 4C illustrates a schematic sectional view along line C-C' of FIG. 3.

Reference is now made to FIG. 3 and FIG. 4C. FIG. 3 illustrates one of the second intersections X2, which is formed by one of the selection lines 130 intersected with one of the first signal lines 110. FIG. 4C illustrates a schematic sectional view along line C-C' of FIG. 3. As shown in FIG. 4C, the illustrated selection line 130 is disposed over the first signal line 110. In some embodiments, the pixel array "a" further includes an insulating layer IL disposed between the first signal line 110 and the selection line 130. The first signal line 110 is electrically insulated by the insulating layer IL from the selection line 130. In some embodiments, the pixel array "a" further includes a protecting layer PL covering the selection line 130.

In summary, in the pixel array of the present disclosure, at least one of the second signal lines is disposed between each of the selection lines and any one of the active components of the pixel units. In other words, there must be one or more of the second signal lines disposed between any one of the selection lines and any one of the active components. Since the second signal lines may shield the interference from the signal on the selection lines, the impact on the pixel units from the signal of the selection lines may be reduced. In addition, with the presence of at least one of the second signal lines, the selection lines are not so close to the active components. Therefore, the color unevenness issue in the prior art may be avoided by the layout design of the pixel array in the present disclosure.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A pixel array, comprising:
a plurality of first signal lines;
a plurality of second signal lines intersected with and electrically insulated to the first signal lines;
a plurality of active components, wherein each of the active components is electrically connected to one of the first signal lines and one of the second signal lines;
a plurality of pixel electrodes, wherein each of the pixel electrodes is electrically connected to one of the active components; and
a plurality of selection lines intersected with the first signal lines to form a plurality of first intersections and a plurality of second intersections, wherein the selection lines are electrically connected to the first signal lines at the first intersections and electrically insulated to the first signal lines at the second intersections, and the selection lines are electrically insulated to the second signal lines, wherein at least one of the second signal lines is disposed between each of the selection lines and any one of the active components, and two of the second signal lines and one of the selection lines between said two second signal lines are disposed between adjacent ones of the active components.

2. The pixel array of claim 1, wherein the second signal lines are twice as many of the selection lines.

3. The pixel array of claim 1, wherein the second signal lines are twice as many of the first signal lines.

4. The pixel array of claim 1, wherein a number of the first signal lines is less than or equal to that of the selection lines.

5. The pixel array of claim 1, wherein each of the first signal lines is a scanning line, and each of the second signal lines is a data line.

6. The pixel array of claim 1, wherein the selection lines and the second signal lines are made of a same material.

7. The pixel array of claim 1, further comprising an insulating layer disposed between the first signal lines and the second signal lines, and the first signal lines are electrically insulated by the insulating layer from the second signal lines.

8. The pixel array of claim 1, further comprising an insulating layer disposed between the first signal lines and the selection lines, and the first signal lines are electrically insulated by the insulating layer from the selection lines at the second intersections.

9. The pixel array of claim 1, wherein the second signal lines and the selection lines are extended along a same direction.

* * * * *